United States Patent
Yanamanamanda et al.

(10) Patent No.: US 9,236,133 B2
(45) Date of Patent: Jan. 12, 2016

(54) ADJUSTED READ FOR PARTIALLY PROGRAMMED BLOCK

(71) Applicant: Micron Technology, Inc., Boise, ID (US)

(72) Inventors: Satish K. Yanamanamanda, San Jose, CA (US); Sampath K. Ratnam, Boise, ID (US)

(73) Assignee: Micron Technology, Inc., Boise, ID (US)

(*) Notice: Subject to any disclaimer, the term of this patent is extended or adjusted under 35 U.S.C. 154(b) by 21 days.

(21) Appl. No.: 14/106,070

(22) Filed: Dec. 13, 2013

(65) Prior Publication Data

US 2015/0170751 A1    Jun. 18, 2015

(51) Int. Cl.
*G11C 16/06* (2006.01)
*G11C 16/26* (2006.01)

(52) U.S. Cl.
CPC ..................................... *G11C 16/26* (2013.01)

(58) Field of Classification Search
CPC ........... G11C 16/3418; G11C 16/3427; G11C 11/4063; G11C 2029/0409; G11C 29/44; G11C 29/808; G11C 5/06; G11C 7/10
See application file for complete search history.

(56) References Cited

U.S. PATENT DOCUMENTS

| | | | |
|---|---|---|---|
| 8,417,914 B2 | 4/2013 | Manning et al. | |
| 2004/0210708 A1* | 10/2004 | Conley | 711/103 |
| 2011/0038203 A1* | 2/2011 | Camp et al. | 365/185.02 |
| 2013/0051148 A1 | 2/2013 | Lee et al. | |
| 2013/0073786 A1 | 3/2013 | Belgal et al. | |

\* cited by examiner

*Primary Examiner* — Thong Q Le
(74) *Attorney, Agent, or Firm* — Brooks, Cameron & Huebsch, PLLC

(57) ABSTRACT

The present disclosure is related to an adjusted read for a partially programmed block. A number of methods can include receiving a read request including a logical address, translating the logical address to a physical address and simultaneously determining whether a physical address associated with the read request is in a block that is partially programmed, and in response to the physical address being in the block that is partially programmed, adjusting a read signal level based on a proximity of the physical address to a last written page in the block.

26 Claims, 5 Drawing Sheets

US 9,236,133 B2

1

ADJUSTED READ FOR PARTIALLY PROGRAMMED BLOCK

TECHNICAL FIELD

The present disclosure relates generally to semiconductor memory and methods, and more particularly, to an adjusted read for a partially programmed block.

BACKGROUND

Memory devices are typically provided as internal, semiconductor, integrated circuits in computers or other electronic devices. There are many different types of memory including volatile and non-volatile memory. Volatile memory can require power to maintain its data (e.g., host data, error data, etc.) and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory devices can be combined together to form a storage volume of a memory system such as a solid state drive (SSD). A solid state drive can include non-volatile memory (e.g., NAND flash memory and NOR flash memory), and/or can include volatile memory (e.g., DRAM and SRAM), among various other types of non-volatile and volatile memory.

An SSD can be used to replace hard disk drives as the main storage volume for a computer, as the solid state drive can have advantages over hard drives in terms of performance, size, weight, ruggedness, operating temperature range, and power consumption. For example, SSDs can have superior performance when compared to magnetic disk drives due to their lack of moving parts, which may avoid seek time, latency, and other electro-mechanical delays associated with magnetic disk drives.

As memory devices are scaled to smaller sizes, an available read window between different programmed states for a memory cell may shrink. To address possible read errors associated therewith, some devices may employ read retry mechanisms and/or error recovery. However, such mechanisms may reduce performance of the memory devices in terms of latency.

DETAILED DESCRIPTION

Figure 1:
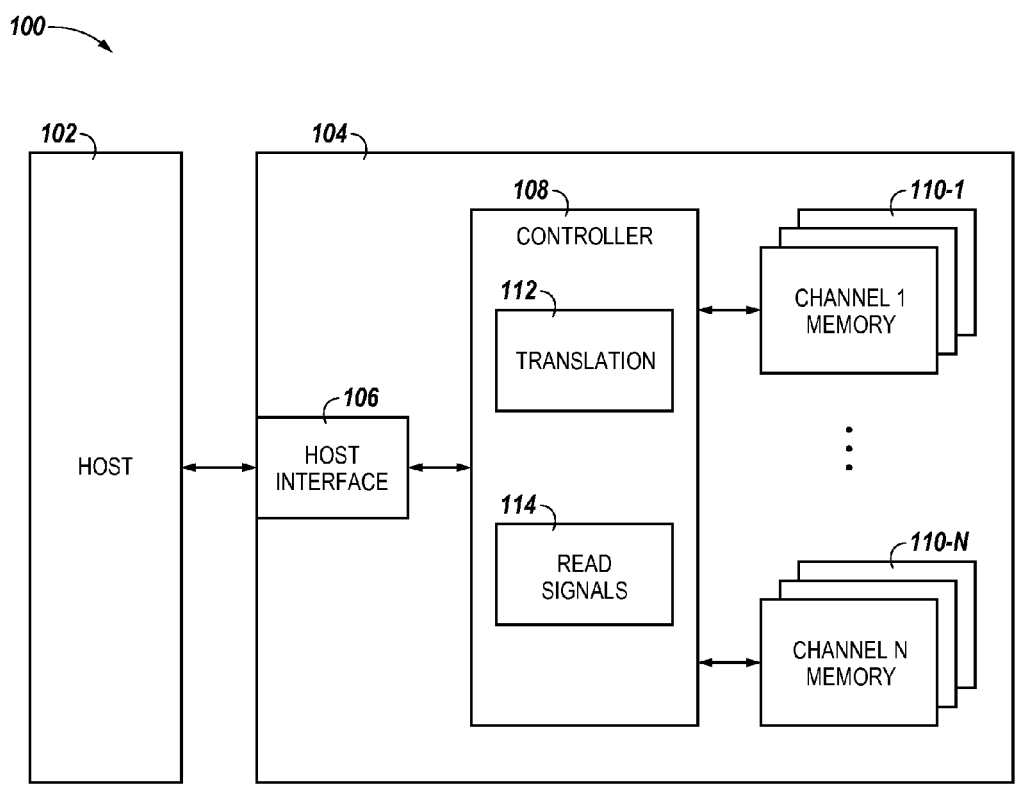
FIG. 1 is a block diagram of an apparatus in the form of a computing system including at least one memory system in accordance with a number of embodiments of the present disclosure.

The present disclosure is related to an adjusted read for a partially programmed block. A number of methods can include receiving a read request including a logical address, translating the logical address to a physical address and simultaneously determining whether a physical address associated with the read request is in a block that is partially programmed, and in response to the physical address being in a block that is partially programmed, adjusting a read signal level based on a proximity of the physical address to a last written page in the block.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designators "N" and "M", particularly with respect to reference numerals in the drawings, indicates that a number of the particular feature so designated can be included. As used herein, "a number of" a particular thing can refer to one or more of such things (e.g., a number of memory devices can refer to one or more memory devices).

The figures herein follow a numbering convention in which the first digit or digits correspond to the drawing figure number and the remaining digits identify an element or component in the drawing. Similar elements or components between different figures may be identified by the use of similar digits. For example, 321 may reference element "21" in FIG. 3, and a similar element may be referenced as 421 in FIG. 4. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of an apparatus in the form of a computing system 100 including at least one memory system 104 in accordance with a number of embodiments of the present disclosure. As used herein, a memory system 104, a controller 108, or a memory device 110 might also be separately considered an "apparatus." The memory system 104 can be a solid state drive (SSD), for instance, and can include a host interface 106, a controller 108 (e.g., a processor and/or other control circuitry), and a number of memory devices 110-1, . . . , 110-N (e.g., solid state memory devices such as NAND flash devices), which provide a storage volume for the memory system 104. The memory system 104 can be a single memory device.

As illustrated in FIG. 1, the controller 108 can be coupled to the host interface 106 and to the memory devices 110-1, . . . , 110-N via a plurality of channels and can be used to send data between the memory system 104 and a host 102. The interface 106 can be in the form of a standardized interface. For example, when the memory system 104 is used for data storage in a computing system 100, the interface 106 can be a serial advanced technology attachment (SATA), peripheral component interconnect express (PCIe), or a universal serial bus (USB), among other connectors and interfaces. In general, however, interface 106 can provide an interface for passing control, address, data, and other signals between the memory system 104 and a host 102 having compatible receptors for the interface 106.

Host 102 can be a host system such as a personal laptop computer, a desktop computer, a digital camera, a mobile telephone, or a memory card reader, among various other types of hosts. Host 102 can include a system motherboard and/or backplane and can include a number of memory access devices (e.g., a number of processors). Host 102 can also be a memory controller, such as where memory system 104 is a memory device (e.g., having an on-die controller).

The controller 108 can communicate with the memory devices 110-1, . . . , 110-N to control data read, write, and erase operations, among other operations. The memory devices 110-1, . . . , 110-N can be a plurality of memory arrays on a single die, a plurality of memory arrays on multiple dies, or a single memory array on a single die. The controller 108 can be on the same die or a different die than any or all of the memory devices 110-1, . . . , 110-N.

The arrays can be flash arrays with a NAND architecture or a NOR architecture, for example. However, embodiments are not limited to a particular type of memory array or array architecture. Although floating-gate type flash memory cells in a NAND architecture are generally referred to herein, embodiments are not so limited. Other examples include electrically erasable programmable ROM (EEPROM), erasable programmable ROM (EPROM), ferroelectric RAM (FRAM), and resistance variable memory such as phase change random access memory (PCRAM), resistive random access memory (RRAM), and magnetoresistive random access memory (MRAM), among others.

Although not specifically illustrated, in some embodiments, the controller 108 can include a discrete memory channel controller for each channel coupling the controller 108 to the memory devices 110-1, . . . , 110-N. The controller 108 can include, for example, a number of components in the form of hardware and/or firmware (e.g., a number of integrated circuits) and/or software for controlling access to the memory devices 110-1, . . . , 110-N and/or for facilitating data transfer between the host 102 and memory devices 110-1, . . . , 110-N.

The number of memory devices 110-1, . . . , 110-N can include a number of arrays of memory cells (e.g., non-volatile memory cells). The memory cells can be grouped, for instance, into a number of blocks including a number of physical pages. A number of blocks can be included in a plane of memory cells and an array can include a number of planes. As one example, a memory device may be configured to store 8 KB (kilobytes) of user data per page, 128 pages of user data per block, 2048 blocks per plane, and 16 planes per device.

In operation, data can be written to and/or read from memory (e.g., memory devices 110-1, . . . , 110-N of system 104) as a page of data, for example. As such, a page of data can be referred to as a data transfer size of the memory system. Data can be sent to/from a host (e.g., host 102) in data segments referred to as sectors (e.g., host sectors). As such, a sector of data can be referred to as a data transfer size of the host.

As illustrated in FIG. 1, the controller 108 can include logical-to-physical translation circuitry 112 and read signal circuitry 114. Each of the logical-to-physical translation circuitry 112 and read signal circuitry 114 can be discrete components such as an application specific integrated circuit (ASIC) or the components may reflect functionally provided by circuitry and/or executable instructions within the controller 108 that does not necessarily have a discrete physical form separate from other portions of the controller 108. Although illustrated as components within the controller 108 in FIG. 1, each of the logical-to-physical translation circuitry 112 and read signal circuitry 114 can be external to the controller 108 or have a number of components located within the controller 108 and a number of components located external to the controller 108. The functionality described herein as being implemented by the controller 108 (e.g., by the logical-to-physical translation circuitry 112 and/or the read signal circuitry 114) can be provided as a non-transitory electronic device readable medium storing instructions executable by the electronic device (e.g., firmware in the controller 108) to provide the functionality.

The logical-to-physical translation circuitry 112 can be used to convert between host and/or file system addresses and memory addresses. In some embodiments, the logical-to-physical translation circuitry 112 can include a flash translation layer (FTL). The logical-to-physical translation circuitry 112 can be used (e.g., during a programming operation performed on the memory devices 110-1, . . . , 110-N) to map a logical address associated with a data entry to a physical address in the memory devices 110-1, . . . , 110-N. The logical-to-physical translation circuitry 112 may include an address mapping table in the local memory of the controller 108 to perform the mapping operation. A host 102 can use logical block addresses (LBAs) when addressing a memory system 104. The logical-to-physical translation circuitry 112 can translate an LBA to a physical location in the memory devices 110-1, . . . , 110-N, and vice versa. This allows the host 102 to ignore the physical characteristics of the memory devices 110-1, . . . , 110-N and treat the memory system 104 as a contiguous linear map of logical sectors. Each host operation can be translated into a single or multi-sector memory operation.

The host 102 can access data on the memory system 104 using a linear mapping of sectors translated by the logical-to-physical translation circuitry 112. One LBA can be used to address one sector of data from the host 102. Although sectors may be any size, some examples of standard sector sizes include 512, 520, 528, and 4096 bytes. The logical-to-physical translation circuitry 112 can use a logical page number (LPN) as an abstraction to manage sectors on the memory system 104. Based on the LBA size and the LPN size, one or multiple LBA can map logically to one LPN. LPNs can be used to define a linear mapping of data onto the physical pages of the memory devices 110-1, . . . , 110-N. For example, one, two, or four LPNs, among other numbers of LPNs can map to one physical page. A physical block number (PBN) can specify the actual location of the data within the memory devices 110-1, . . . , 110-N. The PBN can include a specific channel, chip enable, logical unit number, plane, block, page, position, and an indication of status. A virtual page number (VPN) can specify the logical address of data, but instead of user data, it maps to a location in a table entry in the address mapping table used by the logical-to-physical translation circuitry 112. A VPN can be thought of as an LPN for table entries. Some examples of status information include whether or not a physical block is partially programmed and an indication of the last written page in a physical block, among others. The logical-to-physical translation circuitry 112 can track a last written page for partially programmed blocks. In some embodiments, the logical-to-physical translation circuitry 112 can store that information in the table.

The logical-to-physical translation circuitry 112 can receive a read request including a logical address (e.g., an LBA). The logical-to-physical translation circuitry 112 can translate the logical address to a physical address and simultaneously determine whether the physical address is in a block that is partially programmed (e.g., according to the status information identified as part of the address translation process). As used herein, simultaneous translation of the logical address to a physical address and determination whether the physical address is in a block that is partially programmed can mean that the translation and determination are performed by a same component (the logical-to-physical translation circuitry 112) as part of a same process (the address translation process) and/or that the translation and determination occur at the same time. The logical-to-physical translation circuitry 112 can determine whether a physical address is within a threshold number of physical addresses from a last written page in the block that is partially programmed. Such determinations can be made by the logical-to-physical translation circuitry 112 (e.g., as part of the address translation process) before a read request is sent from the logical-to-physical translation circuitry 112 and/or before a read command corresponding to the read request is issued to the memory devices 110-1, . . . , 110-N and/or pages of memory stored thereon.

Because the determination can be made by the logical-to-physical translation circuitry 112 simultaneously with the translation of the address, there is little or no impact on system performance versus some alternate approaches. For example, the determination can be made without reading, testing, or otherwise accessing the memory devices 110-1, . . . , 110-N to determine whether various pages have been programmed or not. The determination can be made without having to read a counter of which pages have been programmed in each block in response to a read request. The determination can be made without having to read a flag stored that indicates whether or not each block is partially programmed. According to a number of embodiments of the present disclosure, such information is ascertainable from status information associated with the logical-to-physical translation tables and therefore is already accessed as part of the logical-to-physical address translation process. Furthermore, according to some alternate approaches, a determination would still have to be made as to which page was the last written page, even after determining whether a particular block was partially programmed. According to the present disclosure, such an additional step is not necessary.

In response to a physical address being in a block that is partially programmed (e.g., as determined by the logical-to-physical translation circuitry 112), the read signal circuitry 114 can adjust a read signal level (e.g., a default read signal level) based on a proximity of a physical address to a last written page in a physical block (e.g., in response to the read request being received before the block is fully programmed). For example, the read signal circuitry 114 can adjust the read signal level in response to the physical address being within a threshold number of physical addresses from a last written page in the block that is partially programmed. The read signal circuitry 114 can adjust the read signal level before a read command corresponding to the read request is issued to the memory devices 110-1, . . . , 110-N. In some embodiments, the read signal circuitry 114 can adjust the read signal level such that subsequent read requests for the physical address are read using the adjusted read signal level. For example, the read signal circuitry 114 can store the adjusted read signal level for subsequent reads until a number of subsequent pages in the block are programmed (e.g., until the block is fully programmed). A previous read signal level can be restored for the physical address in response to the block subsequently being fully programmed and/or in response to a number of additional physical pages (e.g., a next physical page) within the block being subsequently programmed. In response to receiving a physical address being in a fully programmed block and/or not corresponding to a last written page in a partially programmed block, the read signal circuitry 114 can use a default read signal level.

The logical-to-physical translation circuitry 112 can receive a read request including a logical address. The logical-to-physical translation circuitry 112 can translate the logical address to a physical address and simultaneously determine whether the physical address corresponds to a last written page in a block of memory cells. The read signal circuitry 114 can use a default read signal level in response to the physical address not corresponding to the last written page in the block of memory cells. The read signal circuitry 114 can use an adjusted read signal level in response to the physical address corresponding to the last written page in the block of memory cells, wherein the block of memory cells comprises a partially programmed block of memory cells.

Read requests can originate from the host 102 and/or from the memory system 104, among other originations (e.g., from a direct memory access (DMA) device). For example, a read request can originate from the memory system 104 as part of a wear leveling operation. The memory system 104 can implement wear leveling (e.g., garbage collection and/or reclamation) to control the wear rate on the memory devices 110-1, . . . , 110-N. A memory array can experience errors (e.g., failures) after a number of program and/or erase cycles. Wear leveling can reduce the number of program and/or erase cycles performed on a particular group by spreading the cycles more evenly over the entire array. Wear leveling can include dynamic wear leveling to minimize the amount of valid blocks moved to reclaim a block. Dynamic wear leveling can include a technique called garbage collection. Garbage collection can include reclaiming (e.g., erasing and making available for writing) blocks that have the most invalid pages (e.g., according to a "greedy algorithm"). Alternatively, garbage collection can include reclaiming blocks with more than a threshold amount of invalid pages. If sufficient free blocks exist for a writing operation, then a garbage collection operation may not occur. An invalid page, for example, can be a page of information that has been updated to a different page. Static wear leveling can include writing static information to blocks that have high erase counts to prolong the life of the block.

Figure 2:
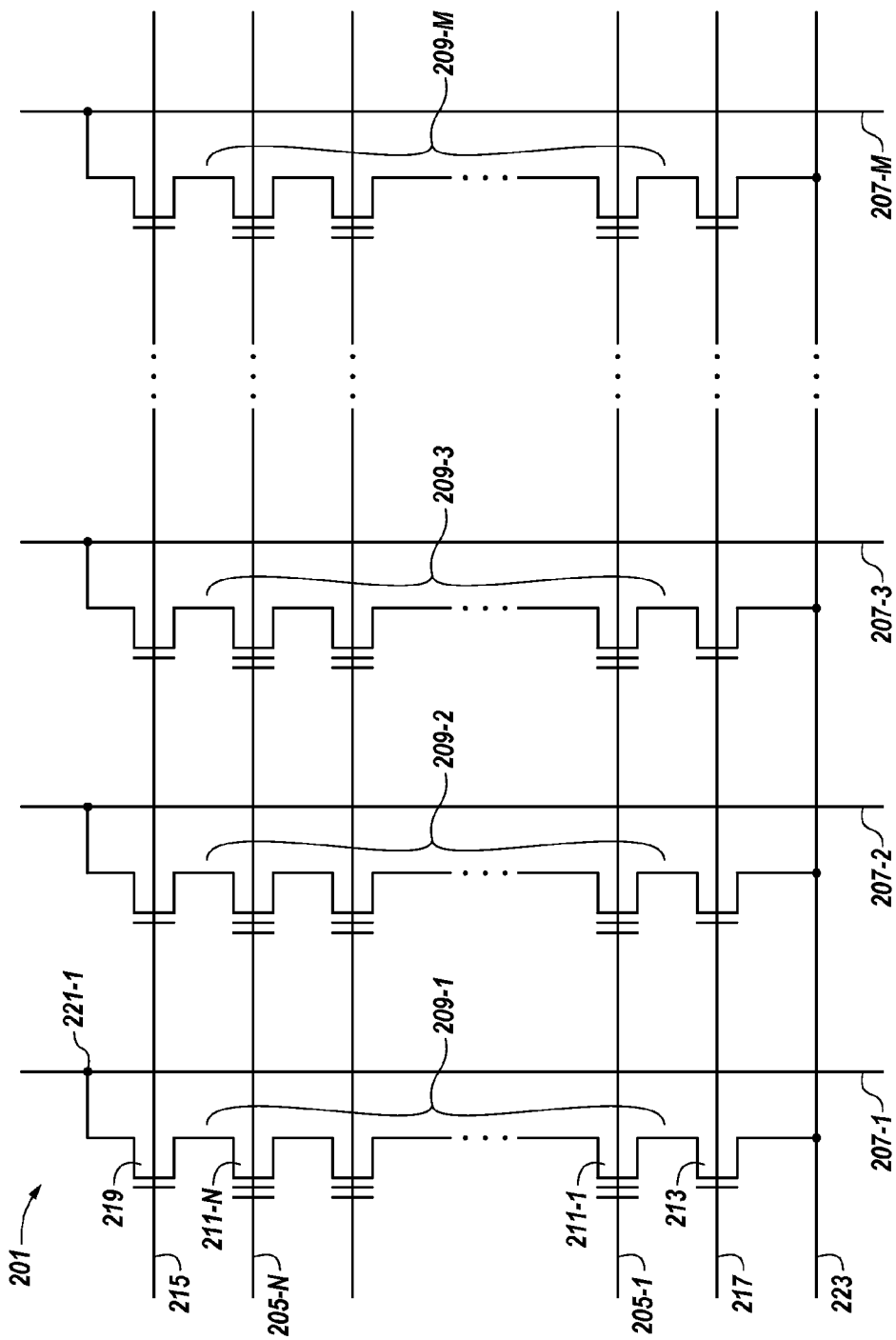
FIG. 2 illustrates a schematic diagram of a portion of a non-volatile memory array in accordance with a number of embodiments of the present disclosure.

FIG. 2 illustrates a schematic diagram of a portion of a non-volatile memory array in accordance with a number of embodiments of the present disclosure. The memory array can be can be contained within the memory devices 110-1, . . . , 110-N illustrated in FIG. 1. The embodiment of FIG. 2 illustrates a NAND architecture non-volatile memory array. However, embodiments described herein are not limited to this example. As shown in FIG. 2, the memory array 201 includes access lines (e.g., word lines 205-1, . . . , 205-N) and intersecting data lines (e.g., local bit lines 207-1, 207-2, 207-3, . . . , 207-M). For ease of addressing in the digital environment, the number of word lines 205-1, . . . , 205-N and the number of local bit lines 207-1, 207-2, 207-3, . . . , 207-M can be some power of two (e.g., 256 word lines by 4,096 bit lines).

Memory array 201 includes NAND strings 209-1, 209-2, 209-3, . . . , 209-M. Each NAND string includes non-volatile memory cells 211-1, . . . , 211-N, each communicatively coupled to a respective word line 205-1, . . . , 205-N. Each NAND string (and its constituent memory cells) is also associated with a local bit line 207-1, 207-2, 207-3, . . . , 207-M. The memory cells 211-1, . . . , 211-N of each NAND string 209-1, 209-2, 209-3, . . . , 209-M are coupled in series source to drain between a source select gate (SGS) (e.g., a field-effect transistor (FET) 213) and a drain select gate (SGD) (e.g., FET 219). Each source select gate 213 is configured to selectively couple a respective NAND string to a common source 223 responsive to a signal on source select line 217, while each drain select gate 219 is configured to selectively couple a respective NAND string to a respective bit line responsive to a signal on drain select line 215.

As shown in the embodiment illustrated in FIG. 2, a source of source select gate 213 is coupled to a common source line 223. The drain of source select gate 213 is coupled to the source of the memory cell 211-1 of the corresponding NAND string 209-1. The drain of drain select gate 219 is coupled to bit line 207-1 of the corresponding NAND string 209-1 at drain contact 221-1. The source of drain select gate 219 is coupled to the drain of the last memory cell 211-N (e.g., a floating-gate transistor) of the corresponding NAND string 209-1.

In a number of embodiments, construction of the non-volatile memory cells 211-1, . . . , 211-N includes a source, a drain, a floating gate or other charge storage structure, and a control gate. The memory cells 211-1, . . . , 211-N have their control gates coupled to a word line, 205-1, . . . , 205-N, respectively. A NOR array architecture would be similarly laid out, except that the string of memory cells would be coupled in parallel between the select gates. Furthermore, a NOR architecture can provide for random access to the memory cells in the array (e.g., as opposed to page-based access as with a NAND architecture).

A number (e.g., a subset or all) of cells coupled to a selected word line (e.g., 205-1, . . . , 205-N) can be written and/or read together as a group. A number of cells written and/or read together can correspond to a page of data. As used herein, examples of high-level operations are referred to as writing or reading operations (e.g., from the perspective of a controller), whereas, with respect to the memory cells, such operations are referred to as programming or sensing. A group of cells coupled to a particular word line and programmed together to respective states can be referred to as a target page. A programming operation can include applying a number of program pulses (e.g., 16V-20V) to a selected word line in order to increase the threshold voltage (Vt) of selected cells coupled to that selected word line to a desired program voltage level corresponding to a targeted state.

Read operations can include sensing a voltage and/or current change of a bit line coupled to a selected cell in order to determine the state of the selected cell. The read operation can include precharging a bit line and sensing the discharge when a selected cell begins to conduct. Two different types of read operations are described herein (e.g., those using a ramping read signal versus using a plurality of discrete read signals).

Sensing the state of a selected cell can include providing a ramping read signal (e.g., −2V to +3V) to a selected word line, while providing a signal (e.g., a pass voltage such as 4.5V) to word lines coupled to the unselected cells of the string sufficient to place the unselected cells in a conducting state independent of the charge stored on the unselected cells. Alternatively, sensing the state of a selected cell could include applying discrete read signal levels (e.g., −0.05V, 0.5V, and 2V) to a selected word line, and thus to the control gate of a selected cell. The bit line corresponding to the selected cell being read and/or verified can be sensed to determine whether or not the selected cell conducts in response to the particular read signal applied to the selected word line. For example, the state of a selected cell can be determined by the word line voltage at which the bit line current reaches a particular reference current associated with a particular state.

According to a number of embodiments of the present disclosure, a read signal level can be adjusted based on the proximity of a physical address associated with a read request to a last written page in the block. A last written page can be a page written to a word line 205-1, . . . , 205-N or a portion thereof. A read signal level can be further adjusted based on the proximity of a physical address associated with a read request to an edge of the block. In addition to any effects that may affect threshold levels for memory cells in a partially programmed block, such effects may be perturbed near an edge of a block of memory cells due to interference from components such as a source, source select line, drain select line, etc. as well as complications in fabrication of the memory array 201 near the edge of the block.

Figure 3:
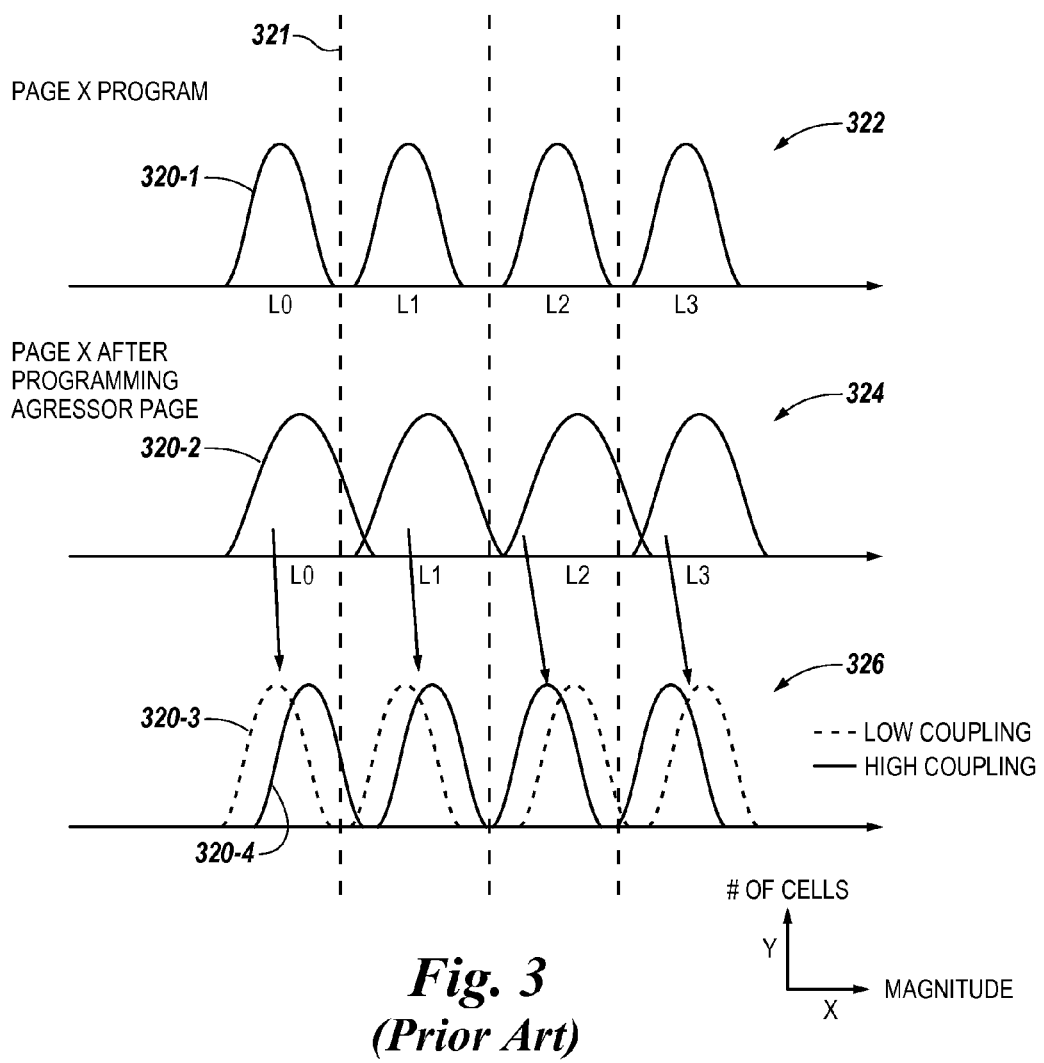
FIG. 3 illustrates a prior art diagram of a change in threshold distributions for programmed states after programming different aggressor pages.

FIG. 3 illustrates a prior art diagram of a change in threshold distributions for programmed states after programming different aggressor pages. At 322, FIG. 3 illustrates four threshold distributions for memory cells after Page X has been programmed. A four-level memory cell can be programmed to one of four programmed states (L0, L1, L2, L3). The threshold distributions are a statistical representation of threshold values for each of a plurality of memory cells programmed to each state, where the x-axis represents magnitude and the y-axis represents the number (or percentage) of memory cells at the corresponding magnitude. For example, threshold distribution 320-1 represents the threshold values for memory cells in Page X that are programmed to state L0. The dotted lines between each distribution can be at a midpoint between each distribution. The corresponding magnitude at each dotted line can be a read signal level for distinguishing between adjacent programmed states (e.g., read signal level 321 can be used to distinguish between programmed states L0 and L1).

At 324, FIG. 3 illustrates threshold distributions for Page X after an aggressor page has been programmed. An aggressor page can be any page, the programming of which affects Page X (e.g., a physically adjacent page or a page within a threshold number of pages of Page X). As used herein, the aggressor page will be considered to be a subsequently programmed page (a page that is programmed after Page X). Comparing the threshold distributions at 322 to the threshold distributions at 324, it can be observed that each of the threshold distributions has widened (has a greater deviation), has a lower peak (fewer cells and/or a lower percentage of cells are programmed to the median value of the distribution), and has moved to the right (increased in average magnitude). Furthermore, the tails on the right side of each distribution have crossed the read signal levels on the right side. For example, the tail of threshold distribution 320-2, which represents the threshold values for memory cells in Page X that are programmed to state L0 after the aggressor page has been programmed, has moved across the read signal level 321, which indicates that some of the memory cells programmed to state L0 may be read incorrectly as being programmed to state L1.

At 326, FIG. 3 illustrates two different sets (dotted and solid lines) of threshold distributions. The dotted lines represent threshold distributions that result on Page X due to relatively lower coupling with a particular aggressor page (comparing between the illustrations at 322 and 326). For example, threshold distribution 320-3, which represents the threshold values for memory cells in Page X that are programmed to state L0 after the aggressor page has been programmed, has had relatively little change from the threshold distribution 320-1. The solid lines represent threshold distributions that result on Page X due to relatively higher coupling between the aggressor page and Page X (comparing between the illustrations at 322 and 326). For example, the tail of threshold distribution 320-4, which represents the threshold values for memory cells in Page X that are programmed to state L0 after the aggressor page has been programmed, has moved across the read signal level 321, which indicates that some of the memory cells programmed to state L0 may be read incorrectly as being programmed to state L1. The threshold distributions illustrated at 324 can be considered to be an average of the relatively lower and relatively higher coupling with aggressor pages.

To account for this program shift that can occur after an aggressor page is programmed, various programming methods may "under program" a page of memory cells with the expectation that the program shift from programming an aggressor page will shift the threshold distributions up to expected and/or targeted distributions (e.g., those illustrated at 322). However, if a number of aggressor pages are not programmed (e.g., in the case of a partially programmed block), then the last written page in the block and/or certain pages within a threshold of the last written page, may be under programmed as illustrated and explained with respect to FIG. 4.

Figures 4, 5:
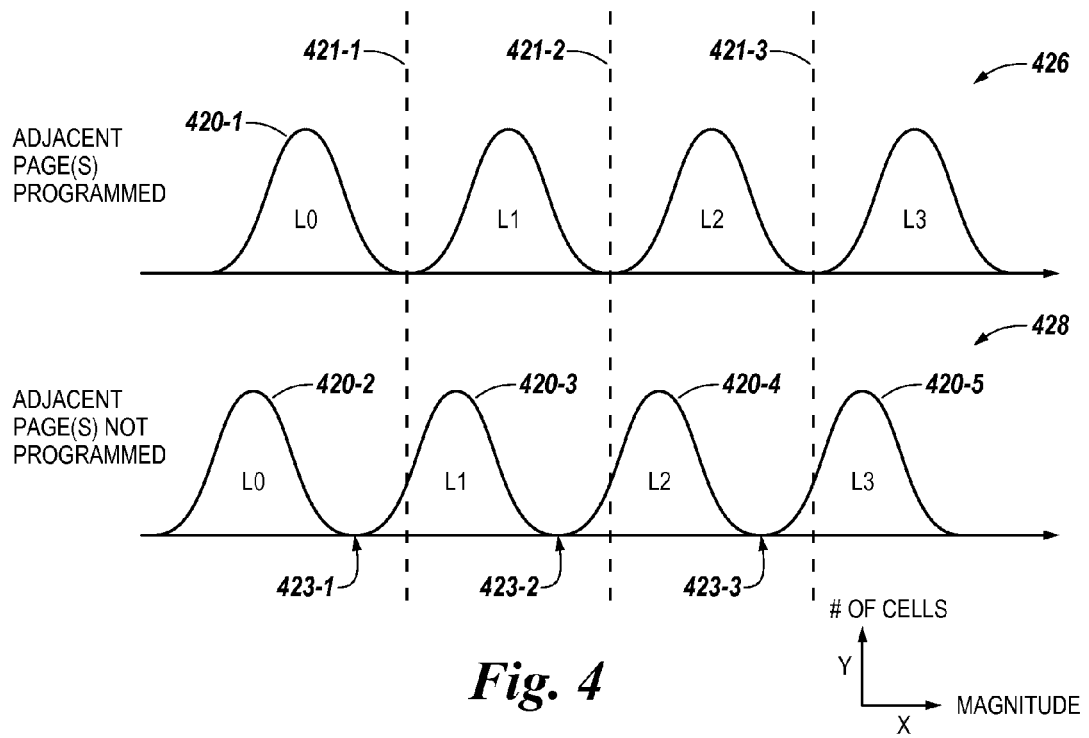
FIG. 4 illustrates a diagram of a difference in threshold distributions for programmed states depending on whether an adjacent page is programmed in accordance with a number of embodiments of the present disclosure.
FIG. 5 illustrates an order of programming various memory pages in accordance with a number of embodiments of the present disclosure.

FIG. 4 illustrates a diagram of a difference in threshold distributions for programmed states depending on whether an adjacent page is programmed in accordance with a number of embodiments of the present disclosure. At 426, FIG. 4 illustrates four threshold distributions for memory cells after a page has been programmed and aggressor pages have been programmed (e.g., adjacent pages). The threshold distribution 420-1 can represent the threshold values for memory cells in the page that are programmed to state L0. The dotted lines between each distribution can be at a midpoint between each distribution. The corresponding magnitude at each dotted line can be a read signal level for distinguishing between adjacent programmed states (e.g., read signal level 421-1 can be used to distinguish between programmed states L0 and L1, read signal level 421-2 can be used to distinguish between programmed states L1 and L2, and read signal level 421-3 can be used to distinguish between programmed states L2 and L3).

At 428, FIG. 4 illustrates threshold distributions for the page before an aggressor page has been programmed. With respect to FIG. 4, programming has occurred with compensation for the above-described shift that can occur with the programming of aggressor pages. For example, a page can be under programmed with the expectation that a shift will occur due to the programming of an aggressor page. Comparing the threshold distributions at 426 to the threshold distributions at 428, it can be observed that each of the threshold distributions at 428 is further to the left (has a lower average magnitude). Furthermore, the tails on the left side of each distribution have crossed the read signal levels on the left side. For example, the tail of threshold distribution 420-3, which represents the threshold values for memory cells in the page that are programmed to state L1 after the aggressor page has been programmed, has moved across the read signal level 421-1, which indicates that some of the memory cells programmed to state L1 may be read incorrectly as being programmed to state L0. According to a number of embodiments of the present disclosure, a number of adjusted read signal levels 423-1, 423-2, 423-3 can be used in response to determining that a page is partially programmed.

For example, the read signal level 421-1 can be adjusted in magnitude to the adjusted read signal level 423-1 to more accurately distinguish between the threshold distribution 420-2 corresponding to the programmed state L0 and the threshold distribution 420-3 corresponding to the programmed state L1. The read signal level 421-2 can be adjusted in magnitude to the adjusted read signal level 423-2 to more accurately distinguish between the threshold distribution 420-3 corresponding to the programmed state L1 and the threshold distribution 420-4 corresponding to the programmed state. L2. The read signal level 421-3 can be adjusted in magnitude to the adjusted read signal level 423-3 to more accurately distinguish between the threshold distribution 420-4 corresponding to the programmed state L2 and the threshold distribution 420-5 corresponding to the programmed state L3. Other adjusted read signal levels can be used as described herein (e.g., to distinguish between different states, to account for different levels of coupling between different aggressor pages, etc.).

FIG. 5 illustrates an order of programming various memory pages in accordance with a number of embodiments of the present disclosure. The grid illustrated includes a number of word lines 505 (AL1, AL2, AL3, AL4, AL5, AL6) and a number of "odd" and "even" bit lines 507 (E, O, E, O). Pages of memory cells can be divided between odd and even numbered memory cells along a word line. In a number of embodiments, an "odd" or "even" page of data can be a logical representation of data where data from half (the "odd" numbered) of the memory cells coupled to a word line are stored in an "odd" page and data from the other half (the "even" numbered) of the memory cells coupled to the word line are stored in an "even" page.

The numbers within the grid indicate an order of programming (e.g., numerically from 0-15 as illustrated). For example, programming can begin with an even lower page 530-2 on word line AL2 (0), then an odd lower page 530-2 on AL2 (1), followed by an even lower page 530-1 on AL1 (2), then an odd lower page 530-1 on AL1 (3), followed by an even lower page 530-3 on AL3 (4), then an odd lower page 530-3 on AL3 (5), followed by an even upper page 532-1 on AL1 (6), then an odd upper page 532-1 on AL1 (7), and so on. However, this is just an example and embodiments are not limited to a particular order of programming. Furthermore, embodiments are not limited to programming odd and even pages on a word line, as embodiments can include all bit line (ABL) programming, where memory cells associated with all bit lines along a word line are programmed and/or read simultaneously. Likewise, programming along a word line can be broken down into finer granularity than odd and even. Memory can be programmed with greater or fewer than two pages (lower and upper).

With respect to FIG. 5, each word line can be programmed with a lower page 530-1, 530-2, 530-3, 530-4, 530-5 and an upper page 532-1, 532-2, 532-3. As illustrated, the block is partially programmed because word lines AL1, AL2, and AL3 have both of their lower pages 530-1, 530-2, 530-3 and upper pages 532-1, 532-2, 532-3 programmed, while word lines AL4 and AL5 have only their lower pages 530-4, 530-5 programmed, and AL6 has not been programmed. According to a number of embodiments of the present disclosure, a number of read signal levels can be adjusted to account for the fact that the block is partially programmed, which may lead to varying degrees of under programming for a last written page and/or for a number of pages within a threshold of the last written page. A "last written page" and be a sequentially last written page (e.g., odd upper page 532-3 along word line AL3 in this example) or a geometrically last written page (e.g., odd and even lower pages 530-5 along word line AL5 in this example). That is, a sequentially last written page is the last page written based on an order in which the pages are written (e.g., last in time). A geometrically last written page can be a page written along a word line that is closest to an unwritten word line in the block (e.g., odd and even lower pages 530-5 along word line AL5 in this example). Pages within a threshold of the last written page can be pages within a threshold in terms of physical distance (e.g., a number of word lines away from the word line including the geometrically last written page) and/or within a threshold number of pages in terms of a sequence of pages written for a sequentially last written page, among other thresholds.

A memory controller (e.g., memory controller 108 illustrated in FIG. 1) can store different read signal levels to account for different circumstances that may affect the expected threshold distributions in a partially programmed block. Adjusting a read signal level can include adjusting the read signal level in response to a word line corresponding to a physical address associated with a read request being within a threshold number of word lines (e.g., one word line) from a word line including the last written page. For example, in FIG. 5, the last sequentially written page is the upper odd page 532-3 along word line AL3 and if the threshold is one, then the read signal level would be adjusted for a read of the word line AL3 or a read of the word line AL2. In such an example, reads of the lower pages along word lines AL4 and AL5 may have adjusted read signal levels due to the fact that upper pages of those word lines have not yet been programmed.

Adjusting a read signal level can include selecting a first adjusted read signal level in response to a physical address corresponding to a read request being within a first number of word lines from a word line including the last written page and selecting a second adjusted read signal level in response to the physical address being within a second number of word lines from the word line including the last written page. For example, in FIG. 5, the last sequentially written page is the upper odd page 532-3 along word line AL3 and if the first number is zero and if the second number is one, then the first adjusted read signal level would be used to read word line AL3 and the second adjusted read signal level would be used to read word line AL2. According to a number of embodiments of the present disclosure the first and/or second adjusted read signal levels can be further refined to account for differences when the last written page is an odd page or an even page. In such an example, reads of the lower pages along word lines AL4 and AL5 may have adjusted read signal levels due to the fact that upper pages of those word lines have not yet been programmed.

Adjusting a read signal level can include adjusting the read signal level based on the proximity of a word line corresponding to a physical address to the last written page in the block and proximity of the word line corresponding to the physical address to an edge of the block. Adjusting a read signal level can include selecting a first adjusted read signal level in response to the last written page including a first portion (e.g., an odd page or an even page) of memory cells coupled to a word line and selecting a second adjusted read signal level in response to the last written page being a second portion (e.g., the other of odd or even) of memory cells coupled to the word line. Adjusting a read signal level can include selecting a first adjusted read signal level in response to the last written page being an upper page of data and selecting a second adjusted read signal level in response to the last written page being a lower page of data. Adjusted read signal levels can be used based on whether the last written page (geometrical and/or sequential) is an upper page, a lower page, an odd page, an even page, a lower even page, a lower odd page, an upper odd page, or an upper even page, among others. Adjusted read signal levels can be different for each type of last written page or adjusted read signal levels can be common to two or more (or even all) of the types of last written pages. In a number of embodiments, an adjusted read signal level may be used for only one type of last written page (e.g., an upper even page) or only two types of last written pages (e.g., an upper even or odd page), among other combinations. For embodiments in which an adjusted read signal level is used for only certain types of last written pages, a default read signal level can be used for other types of pages.

Figure 6:
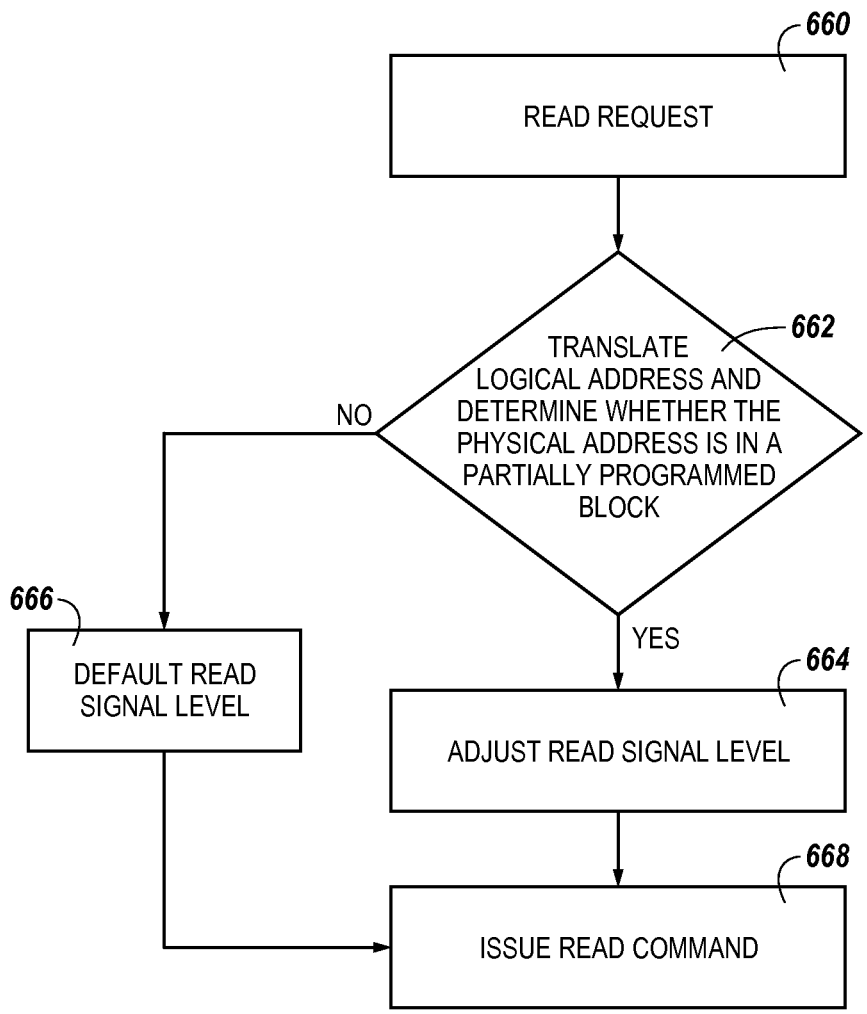
FIG. 6 is a flow chart illustrating a method of operating memory in accordance with a number of embodiments of the present disclosure.

FIG. 6 is a flow chart illustrating a method of operating memory in accordance with a number of embodiments of the present disclosure. At 660 a read request can be received (e.g., from a host, such as host 102 illustrated in FIG. 1). At 662, an address associated with the read request can be translated to a physical address and a determination can be made as to whether the physical address is in a partially programmed block. As described with respect to FIG. 1, such determination can be performed as part of the address translation process (e.g., by logical-to-physical translation circuitry 112 illustrated in FIG. 1). For example, a number of entries in a number of tables used for address translation can also indicate whether a block including a translated physical address is partially programmed. Such embodiments can be advantageous in reducing latency associated with other methods of determining whether a block is partially programmed.

If the block is partially programmed and/or if the physical address is within a threshold of a last written page in the partially programmed block, then a read signal level can be adjusted as indicated at 664. Adjusting the read signal level can include selecting one of a plurality of adjusted read signal levels (e.g., preset adjusted read signal levels). However, if the block is not partially programmed and/or if the physical address is not within a threshold (e.g., a proximity threshold) of a last written page in a partially programmed block, then a default read signal level can be used as indicated at 666. At 668, a read command can be issued to a memory device that includes the physical address.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method comprising:
receiving a read request including a logical address;
translating the logical address to a physical address and simultaneously determining whether the physical address is in a block that is partially programmed; and
in response to the physical address being in the block that is partially programmed, adjusting a read signal level in response to the physical address being in proximity to a last written page in the block.

2. The method of claim 1, wherein the translating and simultaneously determining is performed by logical-to-physical address translation circuitry.

3. The method of claim 1, wherein adjusting the read signal level comprises selecting one of a plurality of adjusted read signal levels wherein the plurality of adjusted read signal levels include at least a first adjusted read signal level and a second adjusted read signal level.

4. The method of claim 3:
wherein adjusting the read signal level comprises selecting the first adjusted read signal level in response to the last written page comprising a first portion of memory cells coupled to an access line; and
wherein adjusting the read signal level comprises selecting the second adjusted read signal level in response to the last written page comprising a second portion of the memory cells coupled to the access line.

5. The method of claim 3:
wherein adjusting the read signal level comprises selecting the first adjusted read signal level in response to the physical address corresponding to an upper page of data; and
wherein adjusting the read signal level comprises selecting the second adjusted read signal level in response to the physical address corresponding to a lower page of data.

6. The method of claim 3:
wherein adjusting the read signal level comprises selecting the first adjusted read signal level in response to the physical address being within a first number of access lines from the last written page; and
wherein adjusting the read signal level comprises selecting the second adjusted read signal level in response to the physical address being within a second number of access lines from the last written page.

7. The method of claim 1, wherein the method includes, in response to the physical address being in the block that is partially programmed, and in response to the proximity being greater than a threshold proximity, not adjusting the read signal level.

8. The method of claim 1, wherein adjusting the read signal level comprises adjusting the read signal level based on the proximity of the physical address to a last written page in the block and a proximity of the physical address to an edge of the block.

9. The method of claim 1, wherein the method includes receiving the read request from a host.

10. The method of claim 1, wherein the method includes receiving the read request as part of a wear leveling operation initiated by a memory system.

11. A method, comprising:
receiving a read request including a logical address;
translating the logical address to a physical address with logical-to-physical address translation circuitry;
determining, with the logical-to-physical address translation circuitry, whether the physical address is within a threshold number of physical addresses from a last written page in a block that is partially programmed; and
adjusting a read signal level in response to the physical address being within the threshold.

12. The method of claim 11, wherein the determining comprises determining prior to the read request being sent from the logical-to-physical address translation circuitry.

13. The method of claim 11, wherein adjusting the read signal level comprises adjusting the read signal level such that subsequent read requests for the physical address are read using the adjusted read signal level.

14. The method of claim 13, wherein the method includes restoring a previous read signal level for the physical address in response to the block subsequently being fully programmed.

15. The method of claim 13, wherein the method includes restoring a previous read signal level for the physical address in response to a next page in the block being programmed.

16. The method of claim 11, wherein the threshold number of physical addresses correspond to a number of access lines, and wherein, with respect to the number of access lines, the threshold is one access line.

17. An apparatus, comprising:
a memory array; and
a controller coupled to the memory array, wherein the controller includes logical-to-physical address translation circuitry, and wherein the controller is configured to:
track a last written page for a partially programmed block in the memory array with the logical-to-physical address translation circuitry;
translate a received logical address associated with a read request to a physical address with the logical-to-physical address translation circuitry; and
adjust a read signal level for the last written page in response to the read request corresponding to the last written page being received before the block is fully programmed.

18. The apparatus of claim 17, wherein the controller is configured to adjust a read signal level for a page proximal to the last written page in response to a read request corresponding to the page proximal to the last written page being received before the block is fully programmed.

19. The apparatus of claim 17, wherein the controller is configured to store the adjusted read signal level for subsequent reads of the last written page until a subsequent page in the block is programmed.

20. The apparatus of claim 17, wherein the controller is configured to store the adjusted read signal level for subsequent reads of the last written page until the block is fully programmed.

21. An apparatus, comprising:
a memory array; and
a controller coupled to the memory array, wherein the controller is configured to:
write first logical pages of data to first portions of memory cells coupled to access lines;
write second logical pages of data to second portions of memory cells coupled to the access lines after writing the first logical pages of data;
use a default read signal level to read one of the second portions of memory cells; and
adjust the default read signal level for a particular second portion of memory cells in response to receiving a read request for a particular second logical page of data and in response to the particular second portion of memory cells being a last written physical page in a block of memory cells that includes the access lines.

22. The apparatus of claim 21, wherein the controller is configured to adjust the default read signal for the particular second logical page of data before issuing a read command to the particular second logical page of data.

23. The apparatus of claim 21, wherein the controller is configured to further adjust the default read signal level for the particular second logical page of data in response to the particular second logical page of data being stored in a particular access line at an edge of the block of memory cells.

24. The apparatus of claim 21, wherein the controller is configured to adjust the default read signal level for both an upper page of data and a lower page of data corresponding to the particular second logical page of data.

25. The apparatus of claim 21, wherein the first logical pages of data comprise one of a group of logical pages of data comprising even logical pages of data and odd logical pages of data.

26. The apparatus of claim 21, wherein the controller includes logical-to-physical address translation circuitry configured to:
- receive the read request for a particular second logical page of data including a logical address;
- translate the logical address to a physical address; and
- determine that the physical address corresponds to the particular second portion of memory cells and that the second portion of memory cells is the last written physical page in the block of memory cells.

* * * * *